United States Patent [19]

Oliver et al.

[11] Patent Number: 5,561,754
[45] Date of Patent: Oct. 1, 1996

[54] AREA PRESERVING TRANSFORMATION SYSTEM FOR PRESS FORMING BLANK DEVELOPMENT

[75] Inventors: James H. Oliver; Nirmal K. Nair, both of Ames, Iowa

[73] Assignee: Iowa State University Research Foundation, Inc., Ames, Iowa

[21] Appl. No.: 108,194

[22] Filed: Aug. 17, 1993

[51] Int. Cl.$^6$ ................................................ G06F 15/00
[52] U.S. Cl. ............................................................ 395/141
[58] Field of Search .................................... 395/119, 120, 395/121, 127, 129, 138; 364/578, 507, 508, 512, 472, 474.24

[56] References Cited

U.S. PATENT DOCUMENTS

| 4,885,702 | 12/1989 | Ohba | 395/119 |
| 5,107,444 | 4/1992 | Wu | 395/119 |
| 5,255,352 | 10/1993 | Falk | 395/125 |

OTHER PUBLICATIONS

Chu et al.; Computer–Aided Geometric Simulation of Sheet Metal Forming Processes, 1985; pp. 65–76.

Chu, Edmund Wai–Kwok; *New Horizons in Computer–Aided Design of Sheet Metal Stampings*, chapter 3; 1983; pp. 43–102.

Blount et al.; Blank Shape Analysis for Heavy Gauge Metal Forming; 1990; pp. 65–74.

Kincaid, et al., "Numerical Analysis Mathematics of Scientific Computing, " University of Texas at Austin, Brooks/ Cole Publishing, pp. 64–71, 1991.

Meyers, et al., "Surfaces from Contours," University of Alabama at Birming–ham, Association for Computing Machinery, pp. 229–258, 1992.

Kawashima, et al., "A flexible quantitative method for NC machining Verification using a space–division based solid model," *The Visual Computer*, vol. 7, 149–157, 1991.

Jerard, et al., "Approximate methods for simulation and verification of numerically controlled machining programs," *The Visual Computer*, vol. 5, pp. 329–348, 1989.

A. B. Ekoule, et al., "A Triangulation Algorithm from Arbitrary Shaped Multiple Planar Contours," *ACM Transactions on Graphics*, vol. 10, No. 2, pp. 182–199 Apr., 1991.

Malhotra, et al., "Synthesis of Spatially and Intrinsically Constrained Curves Using Simulated Annealing," ASME Transactions, Journal of Mechanical Design, DE–vol. 32–1 Alliances in Design Automation—vol. 1 ASME 1991 pp. 145–155.

Huang, et al., "Five–Axis NC Milling Simulation and Dimensional Verification via Dexel Representation", Computer Aided Design, Special Issue on NC Machining and Cutter Path Generation, B. K. Choi, ed. May 31, 1993, pp. 1–16.

Oliver, et al., "Automated Generation of Sculptured Surface Models", Artificial Intelligence in Optical Design and Manufacturing, Z. Dong, ed., Prentice Hall Environmental and Intelligent Manufacturing Systems Series, M. Jamshidi, Series, ed., 1993 (Aug.), Chapter 1, pp. 1–25.

Ki–Yin Chang, et al., "A Method for NC Toolpath Interference Detetection for a Multi–Axis Milling System," *Control of Manufacturing Processes*, DSC–vol. 52, pp. 23–30, 1991.

(List continued on next page.)

*Primary Examiner*—Phu K. Nguyen
*Attorney, Agent, or Firm*—Schwegman, Lundberg, Woessner & Kluth, P.A.

[57] ABSTRACT

An efficient algorithm determines the blank shape necessary to manufacture a surface by press forming. The technique is independent of material properties and instead uses surface geometry and an area conservation constraint to generate a geometrically feasible blank shape. The algorithm is formulated as an approximate geometric interpretation of the reversal of the forming process. The primary applications for this technique are in preliminary surface design, assessment of manufacturability, and location of binder wrap. Since the algorithm exhibits linear time complexity, it is amenable to implementation as an interactive design aid.

18 Claims, 11 Drawing Sheets

OTHER PUBLICATIONS

R. E. Barnhill, et al., "A marching method for parametric surface/surface intersection," *Computer Aided Geometric Design 7*, pp. 257–280, 1990.

Robert L. Drysdale III, et al., "Disrete Simulation of NC Machining," Algorithmica, pp. 33–60, 1989.

Takafumi Saito, et al., "NC Machining with G–buffer Method," *Computer Graphics*, vol. 25, No. 4, pp. 207–216, Jul. 1991.

Yunching Huang, "Non–Constant Parameter NC Tool Path Generation on Sculptured Surfaces," *Computers in Engineering*, vol. 1, pp. 411–419, 1992.

Tim Van Hook, "Real–Time Shaded NC Milling Display," *Siggraph '86*, vol. 20, No. 4, pp. 15–20, 1986.

Ashish P. Narvekar, Yunching Huang and James H. Oliver, "Intersection of RaysWith Parametric Envelope Surfaces Representing Five–Axis NC Milling Tool Swept Volumes" DE–vol. 44–2, *Advances in Design Automation*, vol. 2, ASME 1992, pp. 223–230.

J. P. Menon and D. M. Robinson, "High Performance NC Verification VIA Massively Parallel Raycasting: Extensions to New Phenomena and Geometric Domains" PED vol. 59, *Concurrent Engineering* ASME 1992, pp. 179–194.

Peter R. Atherton, "A Scan–line Hidden Surface Removal Procedure for Constructive Solid Geometry" *Computer Graphics*, vol. 17, No. 3, Jul. 1983, pp. 73–82.

Michael E. Mortenson, *Geometric Modeling*, Relational Properties, pp. 310–311, 1985.

James D. Foley et al., "Spatial–Partitioning Representations" *Second Edition, Computer Graphics*, Principles and Practice, pp. 549–550 1990.

J. H. Oliver and E. D. Goodman, "Direct Dimensional NC Verification" pp. 2–9 1990.

J. H. Oliver, "Efficient Intersection of Surface Normals with Milling Tool Swept Volumes for Discrete Three–Axis NC Verification", *Journal of Mechanical Design*, Jun. 1992, vol. 114, pp. 283–287.

Robert Light, et al., "Modification of geometric models through variational geometry," *Computer Aided Design*, vol. 14, No. 4, pp. 209–214, Jul. 1982.

Pigel, L. et al., "Curves and Surface Construction Unsing Rational B–splines," *Computer Aided Design*, vol. 19, No. 9, pp. 485–497, Nov., 1987.

Shimada, T. et al., 1989, "Development of Curved Surfaces using Finite Element Method," *Proceedings of the first international conference on Computer–Aided Optimum Design of Structures*, Recent Advances, Springer–Verlag, New York pp. 23–30.

Shimada, T. et al., "Approximate Transformation of Arbitrary Curved Surface into a Plane using Dynamic Programming *Computer–Aided Design*", vol. 23, No. 2, pp. 153–150. Mar., 1991.

Redont, P., "Representation and Deformation of Developable Surfaces," *Computer Aided Design*, vol. 21, No. 1, pp. 13–20, Feb., 1989.

Clements, J. C. et al. "A Fast, Accurate Algorithm for the Isometric Mapping of a Developable Surface," *Siam Journal on Mathematical Analysis*, vol. 18, No. 4, pp. 966–971, Jul., 1987.

AREA PRESERVING TRANSFORMATION SYSTEM FOR PRESS FORMING BLANK DEVELOPMENT

The present invention was made with the support of the U.S. Government under National Science Foundation grant number DDM-9111122, and the Office of Naval Research grant number N0014-92-J-4092. The U.S. Government may have certain rights in the invention.

MICROFICHE APPENDIX

Included with the present specification is a microfiche appendix (one fiche, 75 frames) containing a listing of a source code computer program written in the C language. The program is adapted to execute on a Silicon Graphics Workstation Model CMNB003, Indigo R300 with Elan graphics, under version 4.05 of the Silicon Graphics IRIX operating system, as compiled using ANSI C compiler, Version 3.10.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD OF THE INVENTION

The present invention relates generally to the field of computer-aided design, and most particularly to a system and apparatus for designing press-formed articles.

BACKGROUND OF THE INVENTION

In many industries, the design, analysis, development and production of sheet metal surfaces comprise a substantial portion of component manufacture. The most prevalent manufacturing process for sheet metal components is press forming. In spite of its widespread use, press forming practice has remained somewhat of an art, typically handled by experienced tooling engineers and designers. This is due to the fact that the physical process of press forming is not well understood. Complex interacting mechanisms and features such as friction, metal flow, material properties and boundary conditions make the press forming process difficult to analyze and predict.

In press forming, the initial flat sheet of material used to develop the final shape is called the blank. The main components of the press forming assembly are the punch, die, and the draw binder mechanism which controls the flow of the blank material inward to form the product. Design of this forming assembly is directly dependent on the surface definition of the final product. For a surface design to be manufactured without defects, the blank should be uniformly deformed by the descending punch without thinning or wrinkling. This process is influenced, to a large extent by the draw binder ring, which is placed outside the trim line, i.e., the boundary between the formed surface and surrounding scrap material. To locate the trim line, the designer must determine the boundary of the area on the blank which is affected by the forming process. This process is referred to as blank development. Besides binder-wrap design, the developed blank is also used for punch contact analysis, press forming layout, and as an indicator of material flow during the process.

Iterative redesign of a product which fails in production is very expensive in terms of time and capital investment. It would therefore, be highly useful for product designers to quickly determine the formability of the surface in the early stages of the surface design process. Detailed analysis techniques such as the finite element method are computationally demanding and not amenable for an interactive design environment. Thus, there is a need for quick and qualitative tools which can guide a designer toward a successful design. The present invention provides a technique to bridge the gap between final design analysis and initial surface construction.

DISCUSSION OF THE PRIOR ART

Sculptured surface models are employed in a wide variety of applications in the automotive, aerospace and appliance industries. Such surfaces can be broadly classified as developable or non-developable. A developable surface is characterized by the ability to form the shape by bending a plane without creasing or tearing, i.e., the surface can be generated by sweeping straight lines or generators along a curve in space. Mathematically, a surface is developable if its Gaussian curvature (the product of the principal normal curvatures) is zero everywhere (Mortenson, 1985). This property is often exploited in algorithms to map a developable surface onto a plane (Redont, 1989). Several methods for the transformation of developable surfaces have been formulated (Clements, 1981; Clements and Leon, 1987; Chu et al., 1985). For example, Clements and Leon (1987) developed an algorithm based on the relationship between the generated geodesic lines on the surface to get an accurate blank transformation.

Non-developable surfaces encompass the family of surfaces that have non-zero Gaussian curvatures, and thus cannot be generated by simple bending of a plane without distortion. However, this does not preclude the use of these surfaces in manufacturing since they have advantages over developable surfaces in terms of styling, aerodynamics and other functional aspects of design. To investigate blank shape, Chu, et al., (1985) formulate a simplistic constant area transformation approach for the mapping of a non-developable surface onto a plane. The method is unique from other developments in the field in that it does not include material properties of the sheet metal, but relies exclusively on the geometric properties of the surface. However, the method is limited by an artificial boundary condition requirement, an approximate area conservation method, and it is ineffective for surfaces with vertical flanges, i.e., areas of the surface that lie in planes perpendicular to the blank plane. Blank development of non-developable surfaces has largely remained a finite element analysis problem. Shimada and Tada (1989, 1991) have formulated methods for such transformations of surfaces using both the finite element method and dynamic programming. In the dynamic programming approach, Shimada and Tada (1991) use a two-step algorithm to start a multi-stage decision process using a good initial guess, and then refine the solution to get the final two-dimensional shape. The method requires computation of strain energies and solution of stiffness matrix equations. Both the finite element technique and dynamic programming approach are computationally intensive.

MATERIAL PROPERTY INDEPENDENT APPROACH

Any tangible product is ultimately defined by its geometry; i.e., the geometric aspects of an object qualify it for any purpose. For example, an object's viability with respect to a specific functional configuration is possible only if it is geometrically feasible. It follows that, if an object can be substantiated geometrically, then it may be manufacturable. Therefore, prior to detailed design validation incorporating material properties, the geometric feasibility of a product should first be established. Unlike most physical transformations, geometric transformations are reversible. Thus, if the geometry of a part and its fabrication process are properly modeled, then the fabrication feasibility of the part can be assessed via reverse geometric transformation before detailed process analyses are attempted.

The present invention is motivated by this principle. For blank development, a qualitative indicator is sufficient at the preliminary design stage, and can be arrived at using material independent transformations. In particular, an approach similar to Chu (1983) is adopted by the present invention. The methodology is independent of material properties and relies on basic geometric manipulations to derive the blank shape and other manufacturability properties. The method, however, is distinct from Chu's in that it does not require symmetry boundary conditions, provides an exact area conservation method, and is capable of operating on parts with vertical flanges.

SUMMARY OF THE INVENTION

In sheet metal press forming tool design, the designer strives to achieve a uniform deformation of the blank to the final surface. The ideal deformation process is one in which the surface undergoes this transformation with no change in thickness. To determine such an ideal transformation, the tool designer would need to know where, exactly, each point on the blank lies after deformation. This requirement combined with the concept of geometric reversibility suggests the interpretation of blank development is a geometric transformation problem of mapping the formed surface to a plane such that the area remains constant.

Two fundamental characteristics motivate the present invention: 1) a procedural reversal of the forming process from the formed to the unformed state, and 2) a geometric conservation of area between the two states. In effect, the present invention transforms or "unstamps" the formed three-dimensional geometry into an initial planar shape. Variational geometry principles (Light and Gossard, 1981; Lin et al., 1981) are employed to derive a robust and efficient algorithm for the mapping. Area constraint equations limiting the degrees of freedom of points on the deformed surface are used to map each point to a feasible location in the plane containing the blank. Since the formulation is linear, the results are accurate and computational effort increases in linear proportion to the number of surface elements that are being transformed. A geometrically feasible solution is obtained to give the designer an assessment of initial blank shape, trim line and material flow during the forming process.

The basic assumptions underlying the constant area transformation system of the present invention are summarized as follows:

(a) The surface is represented by a grid of points (vertices) which are considered as the elemental surface entities;
(b) Elemental area entities (triangles) are formed from any three mutually adjacent non-collinear vertices;
(c) The surface is subjected to a state of plane stress only;
(d) The surface is continuous, homogenous and isotropic;
(e) Only plastic deformation is considered; and
(f) The surface has no thickness.

DETAILED DESCRIPTION OF THE INVENTION

In the following Detailed Description of the Preferred Embodiments, reference is made to the accompanying Drawings which form a part hereof, and in which is shown by way of illustration specific embodiments in which the invention may be practiced. It is to be understood that other embodiments may be utilized and structural changes may be made without departing from the scope of the present invention.

Surface Geometry Representation

Contemporary computer-based design tools provide several methods for generating parametric sculptured surface models. The most common representation scheme is the non-uniform rational B-splines (NURBS) surface. A B-spline surface can be represented as $$S(u,v) = \sum_{i=0}^{m} \sum_{j=0}^{n} P_{i,j} N_{i,k}(u) N_{j,l}(v) \quad u, v \in [0,1] \qquad (1)$$

where $S(u,v)$ is a three-dimensional vector function of control points $P_{ij}$ arranged in a topologically rectangular grid and $N_{i,k}(u)$ and $N_{j,l}(v)$ are the degree k and l B-spline basis functions, respectively (Piegl and Tiller, 1987).

Figure 1:
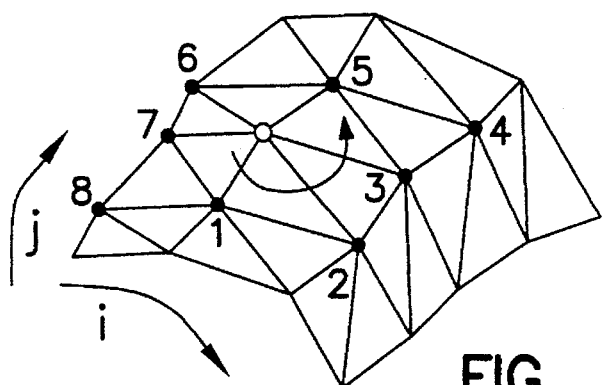
FIG. 1 illustrates a discretized surface model with vertex adjacency relationships and numbering systems.

A well-defined homogenous triangulation of the surface is required as the input to the algorithm. Any surface S(u,v) can be approximated by a faceted polyhedron, defined by a (M×N) set of three-dimensional vertices $V_{ij}=S(u_i,v_j)$, i=1, . . . , M and j=1, . . . , N. The resulting polyhedron approximates the actual surface. Such a polyhedral approximation can be constructed with a specific topological structure to algorithmically exploit vertex adjacency relationships. The nature of this topology depends on the method of surface discretization. In this application, the surface is triangulated in uniform parametric intervals to form a topologically rectangular mesh, which, after mapping through S(u, v) generates a uniform network. The topology of the network is constructed such that any internal vertex has exactly eight surrounding vertices as shown in FIG. 1. The polyhedral surface model is stored in a data structure which distinguishes the topological and geometric information. In particular, a vertex adjacency list is created to establish connectivity between each vertex and its neighbors.

One useful characteristic of an underlying parametric surface representation is the inherent separation of the topological and geometric information. Any surface vertex in Euclidean space has a dual in the parametric domain (i.e., the uv-space). Since the topology of the discrete surface approximation is defined in the parameter space, operations which require adjacency information are simplified. The corresponding geometric information is thus referenced primarily for the area calculations. This separation leads to simple and efficient algorithmic implementation.

Data Structure

The information content for the method of the present invention is reduced to a vertex basis. The topological information for each vertex is stored in the form of a linked list containing pointers to the addresses of its neighbors. The data structure storage requirements are as follows:

| Topological information | |
|---|---|
| Vertex to Vertex adjacency list | 8 records |
| Geometric information | |
| Three-dimensional coords of each vertex | 3 records |
| Two-dimensional coords (to be generated) | 2 records |
| Visit Flag | |
| Vertex transformation status indicator | 1 record |
| Total (for each vertex) = | 14 records |

Algorithm Basis

Figure 2:
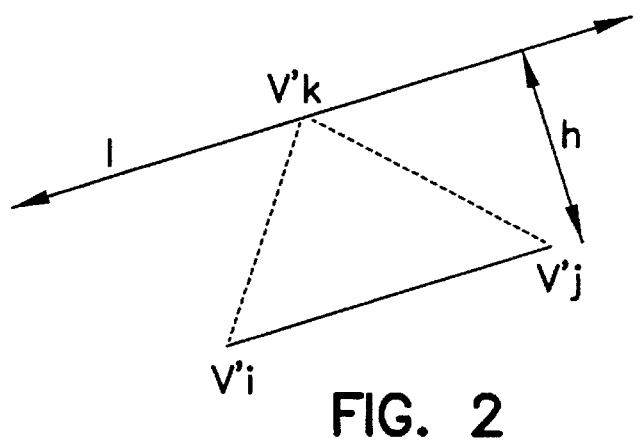
FIG. 2 illustrates the locus of the third vertex of a family of constant area triangles.

Any triangle in three dimensions encloses an area on a plane. The constant area transformation is formulated such that both the topology and the area of a triangle are conserved when it is mapped from a three-dimensional Euclidean space ($E^3$) to a two dimensional planar space ($E^2$). In particular, let $$V^3=\{V_1, V_2, V_3 | V_i \epsilon E^3, V_1 \neq V_2 \neq V_3\} \quad (2)$$

be a set of 3-tuples which define unique triangles in $E^3$, and $$P^2=\{V'_1, V'_2, V'_3 | V'_i \epsilon E^2, V'_1 \neq V'_2 \neq V'_3\} \quad (3)$$

be a set of 2-tuples which define triangles on a plane in $E^2 \subset E^3$. The constant area transformation is defined as a mapping:

$$CAT: V^3 \rightarrow P^2 \text{ such that for any } \alpha \epsilon V^3, \quad (4)$$

$$CAT(\alpha) = \beta \epsilon P^2 | Area(\beta) = Area(\alpha),$$

$$Top(\beta) = Top(\alpha)$$

where Area( ) and Top( ) represent the area and topological state, respectively, of any triangle. A geometric interpretation of the constant area transformation can be summarized by the following principles:

Given the location of two vertices $V'_i$ and $V'_j$, a family of triangles $T(V'_i, V'_j, V'_k)$ of area A is defined by the area locus l of the point $V_k$ which is a line parallel to $V'_iV'_j$ at a distance $h=2A/|V'_iV'_j|$ from $V'_iV'_j$. ( See FIG. 2.)

Figure 3:
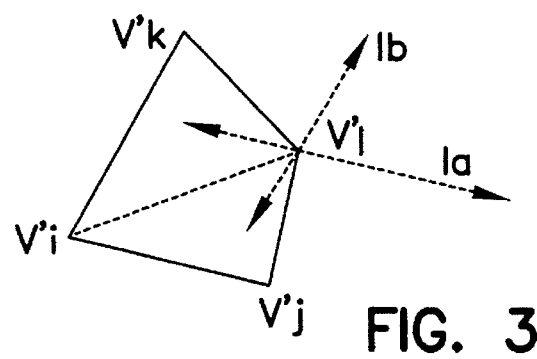
FIG. 3 illustrates the area of conservation principle.

Given two adjacent triangles $T_a(V_i, V_j, V_l)$ and $T_b(V_k, V_i, V_l)$ and corresponding projected locations of any three of these vertices in a plane in $E^2$, say, as shown in FIG. 3, if the unknown common vertex $V_l \epsilon E^2$ is located at the intersection of area loci $l_a \leftarrow T_a(V'_i, V'_j, V'_l)$ and $l_b \leftarrow T_b(V'_k, V'_i, V'_l)$, then $$Area(V_i, V_j, V_l) = Area(V'_i, V'_j, V'_l) \text{ and} \quad (5)$$

$$Area(V_k, V_i, V_l) = Area(V'_k, V'_i, V'_l)$$

Figure 4A:
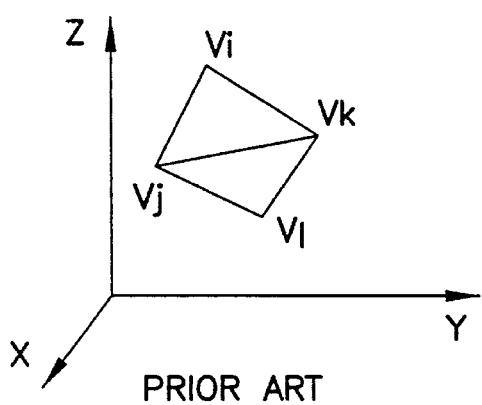
FIGS. 4A, 4B and 4C illustrate the methodology for mapping the fourth vertex of a quadrilateral.
Figure 4C:
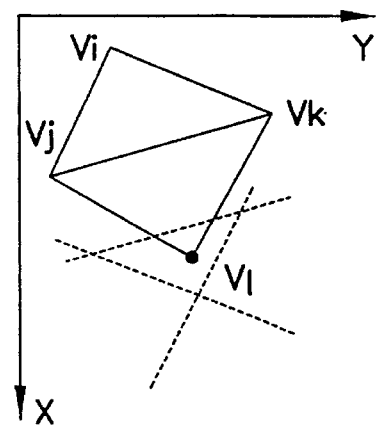
Figure 4B:
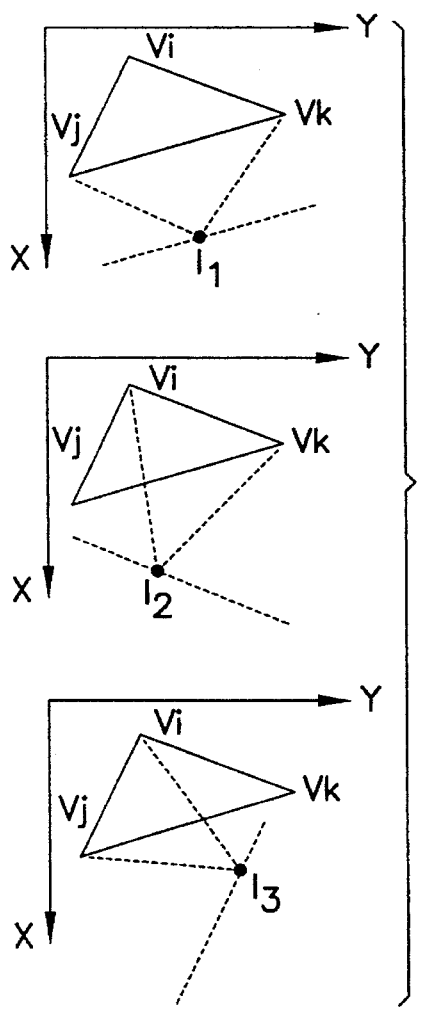
Figure 5:
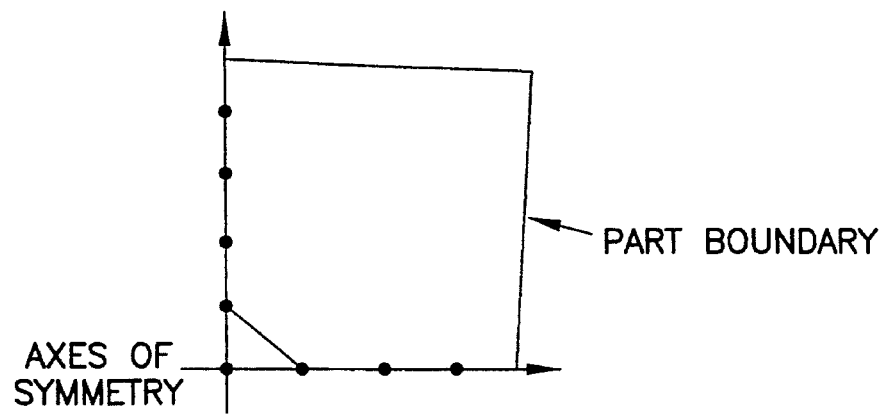
FIG. 5 illustrates the boundary conditions for mapping.

These principles, although similar in spirit to those developed by Chu (1983), provide for several enhancements with respect to practical application and computational accuracy. For example, as illustrated in FIGS. 4A, 4B and 4C, Chu's constant area transformation provides an approximate solution for the location of the fourth point of a mapped quadrilateral. Given the location of three vertices $V_i$, $V_j$ and $V_k$ on adjacent triangles and their images $V'_i$, $V'_j$ and $V'_k$ on a plane, Chu's method assumes that $$Area(V_i,V_j,V_k)=Area(V'_i,V'_j,V'_k) \quad (6)$$

Thus the area change due to the mapping of the quadrilateral ($V_i$, $V_j$, $V_l$, $V_k$) is assumed to be accounted for completely in the image of the triangle ($V_k$, $V_j$, $V_l$). The effect is approximated by constructing the three loci:

$$l_1 \leftarrow T_1 (V_i, V_j, V_l), \quad (7)$$

$$l_2 \leftarrow T_2 (V_k, V_i, V_l),$$

$$l_3 \leftarrow T_3 (V_k, V_j, V_l),$$

assuming, $Area(V'_i, V'_j, V'_l) = Area(V_k, V_j, V_l)$, and $$Area(V'_k, V'_i, V'_l), = Area(V_k, V_j, V_j)$$

as shown in FIG. 4B. Vertex $V'_l$ is taken as the centroid of the area enclosed by $l_1$, $l_2$ and $l_3$ as shown in FIG. 4C. This solution is obviously approximate due to the assumptions used to construct $l_1$ and $l_2$, and the fact that $l_3$ completely neglects any actual area change in the triangle ($V_i$, $V_j$, $V_k$). Since this formulation is this basis of the algorithm to map an entire surface, the error induced by this approximate solution is compounded because, in general, $V_i$, $V_j$ and $V_k$ are themselves calculated via the same procedure.

Another limiting aspect of Chu's formulation is the requirement of imposed boundary conditions necessary to initialize the algorithm. An orthogonal frame of reference along approximate planes of part symmetry must be established on the surface prior to the mapping. This frame is chosen such that the image of the vertices which lie on them can move only along axes formed from the intersection of the blank plane and the symmetry planes, as shown in FIG.

5. Boundary conditions are user-defined, such that the boundary vertices of any two sides of the surface are fixed and identified along the reference frame. Both the symmetry reference frame and the boundary conditions impose restrictions on the material flow which, in general, do not reflect an accurate model of the forming process. The present work, however, derives its methodology from the forming process directly. The surface is assumed to be constrained equally along all edges to provide a restricted inflow of material. In the geometric context, this equates to a "boundary-less" or free-form deformation, since forces (equal along all edges) are not interpreted geometrically. This characteristic of the algorithm is described in detail in the following two sections.

The following terminology is used in the remainder of this section to facilitate the description of the constant area transformation algorithm:

N Total number of vertices on the surface
$V_{ij}$ Address of a specific vertex, i and j correspond to surface parametric direction u and v.
$Adj(V_{ij})$ Vertex adjacency list for each $V_{ij}$
$Vert3D(V_{ij})$ Three-dimensional coordinates of vertex $V_{ij}$
$Flag(V_{ij})$ 1—if vertex $V_{ij}$ is transformed, 0—otherwise
$Vert2D(V_{ij})$ Two dimensional coordinates of the vertex $V_{ij}$
Primary Neighbors Vertices in $Adj(V_{ij})$ which are topologically adjacent to $V_{ij}$ in parameter space, i.e., $V_{i-1,j}$, $V_{i+1,j}$, $V_{i,j-1}$, $V_{i,j+1}$
Secondary Neighbors Other vertices in the $Adj(V_{ij})$ list
Visit_List List of vertices to visit Transformation Initialization Without lack of generality, the algorithm assumes that the blank plane is the global XY-plane and the punch travels parallel to the Z axis. Since thinning is assumed negligible in an ideal forming process, the point of initial punch contact on the blank will most likely lie in the vicinity of the formed surface point which is furthest from the blank plane. Thus, the vertex with the largest Z-value, $V_{max}$, on the interior of the surface is taken as the reasonable starting point for the mapping. To reverse the forming process, "un-forming" of the surface from this initial point creates the effect of reversing the flow of material from the final state to the initial state. (In actual formed products distinct point peaks on the formed surface may not exist, instead a plateau of surface points at the maximum height can be found.) To mimic the uniform inflow of material to form a final surface, a uniform reverse outflow of area is formulated.

Figure 6A:
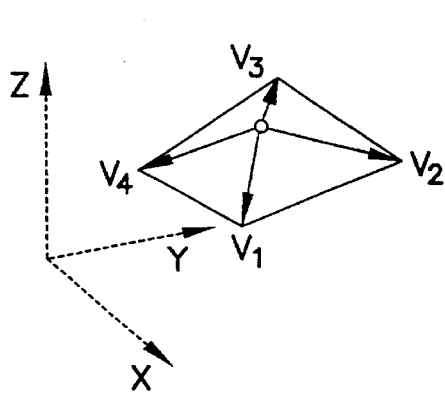
FIGS. 6A and 6B illustrate the transformation of $V_{MAX}$ and the surrounding primary neighbors by preserving the length of line vectors $v_1$, $v_2$, $v_3$, and $v_4$.
Figure 6B:
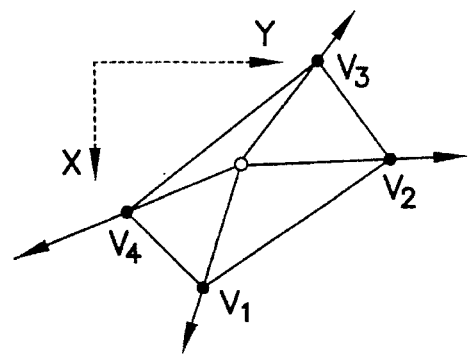

This flow is achieved by allowing the triangular elements to transform in a concentric manner starting with the vertices immediately surrounding $V_{max}$ as shown in FIGS. 6A and 6B. The transformation is initiated by projecting $V_{max}$ parallel to the Z-axis, onto the blank plane. To seed the algorithm, the location of at least two additional vertices (adjacent to $V_{max}$) on the blank plane are required. However, the boundary-less deformation assumption implies a uniform flow of area toward all surface edges. Thus, the locations of the four primary neighbors of $V_{max}$ on the blank plane are required. To map the primary neighbors, area preservation techniques cannot be applied, since $V_{max}$ is the only vertex identified on the plane. Therefore, a length of line preservation procedure is adopted as shown in FIGS. 6A and 6B. Unit vectors, formed between $V_{max}$ and each of its primary neighbors are projected on the blank plane parallel to the Z-axis. The locations for the primary neighbors on the blank plane are approximated by scaling the two-dimensional vectors to their original three-dimensional length.

```
Algorithm. Transform initial primary neighbor vertices
Input: V_max
Output: primary neighbor Vert2D images of V_ij
{
    calculate the primary neighbor vectors
    calculate the lengths of the vectors
    normalize the vectors and project on the blank plane
    scale 2D vectors to 3D lengths
    calculate primary neighbor vert2D point images
    return point images
}
```

The remaining vertices of the surface are then transformed by visiting each vertex and inspecting its neighbors. Each vertex is initially checked for mapping status. If the vertex has not been mapped, the algorithm searches the vertex adjacency list to determine whether at least three adjacent vertices have already been mapped. If the criterion is met, the routine returns that the vertex CAN BE MAPPED. Otherwise, the function returns that the vertex CANNOT BE MAPPED.

```
Algorithm. Vertex map feasibility
Input: V_ij
Output: vertex map feasibility
MAPPED_NEIGHBORS=0
{
    for all V_k ∈ Adj(V_ij)
    {
        if (Flag(V_k) = VISITED)
        {
            add V_k to Mapped_list (V_ij)
            increment MAPPED_NEIGHBORS
        }
    }
    if (MAPPED_NEIGHBORS ≥ 3)
    {
        if at least three consecutive vertices V_k,
        V_k ∈ Mapped_list (V_ij) are VISITED
        return vertex CAN BE MAPPED
        else return vertex CANNOT BE MAPPED
    }
    else return vertex CANNOT BE MAPPED
}
```

A vertex which meets the criterion for mapping is mapped according the area conserving hypothesis. Depending upon the number of starting peaks, there may be more than three mapped neighbors surrounding the vertex which is queried. The solution methodology for the various cases are discussed in the following section.

Moving Front Area Calculation Techniques

In the general multi-peak implementation, cases will arise in which more than the minimum of three mapped neighboring vertices exist for mapping. In other words, the vertex to be mapped is part of one or more moving fronts and its position is affected by its mapped neighbors due to the area constraint. Extra vertices are eliminated to reduce the problem to a three-vertex case by viewing the vertex and its neighborhood in topological space. The solution procedure for the specific cases are discussed here.

Four adjacent neighbors

Figure 7:
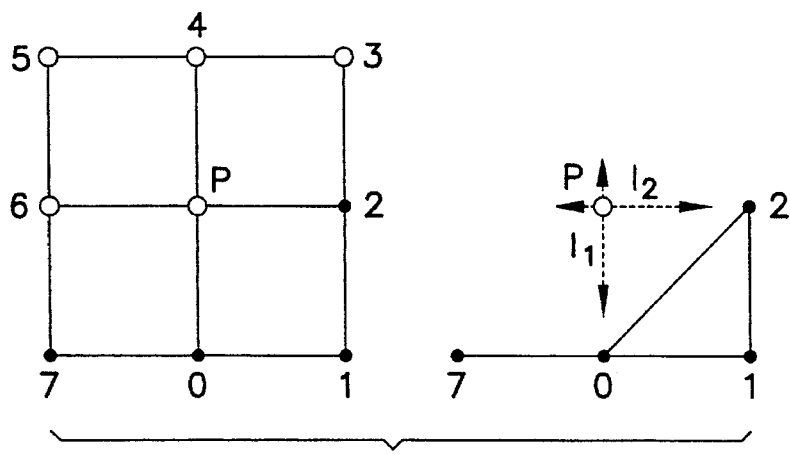
FIG. 7 illustrates the four neighbor case, wherein vertices 7 0, 1 and 2 are mapped.

Consider the case as shown in FIG. 7. For vertex P, neighbors 7, 0, 1 and 2 are already mapped. Overhanging neighbor Vertex 7 is eliminated from the area loci calculations since it is not part of any area enclosing triangle in the topological neighborhood of P. An alternative approach is to consider the area contribution of triangle T(7, 2, 0) in addition to T(0, 2, 1). However, the experimentation with such a formulation revealed that it can induce an undesirable imbalance in the overall map due to the non-uniform attractive and repulsive area components. The elimination of the overhanging neighbor prevents this imbalance. The problem is thus reduced to the three-vertex case (by neglecting the overhanging vertex) and is solved using the principles explained in the preceding sections.

Five adjacent neighbors

Figure 8:
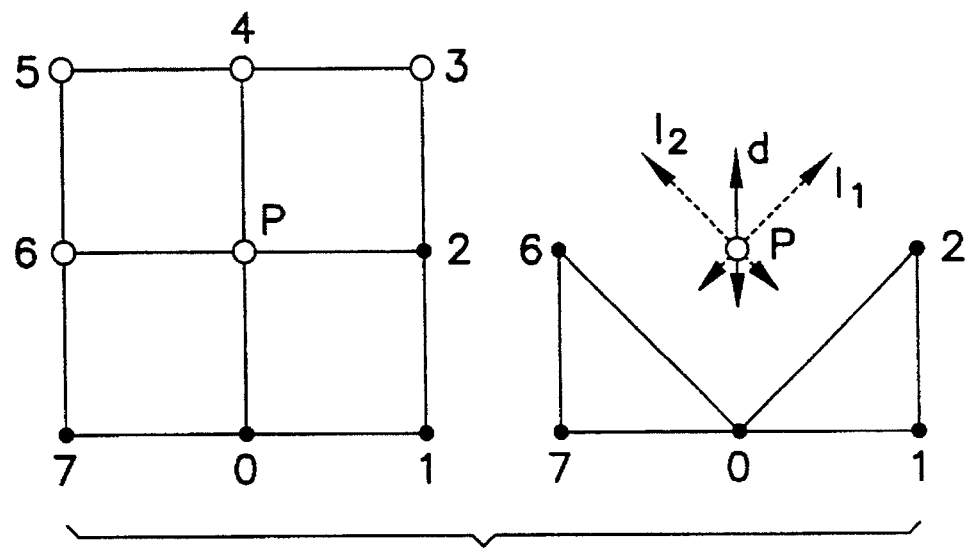
FIG. 8 illustrates the five neighbor case, Type A, wherein it is reduced to a 3-vertex case by considering vertices 6, 0 and 2.
Figure 9:
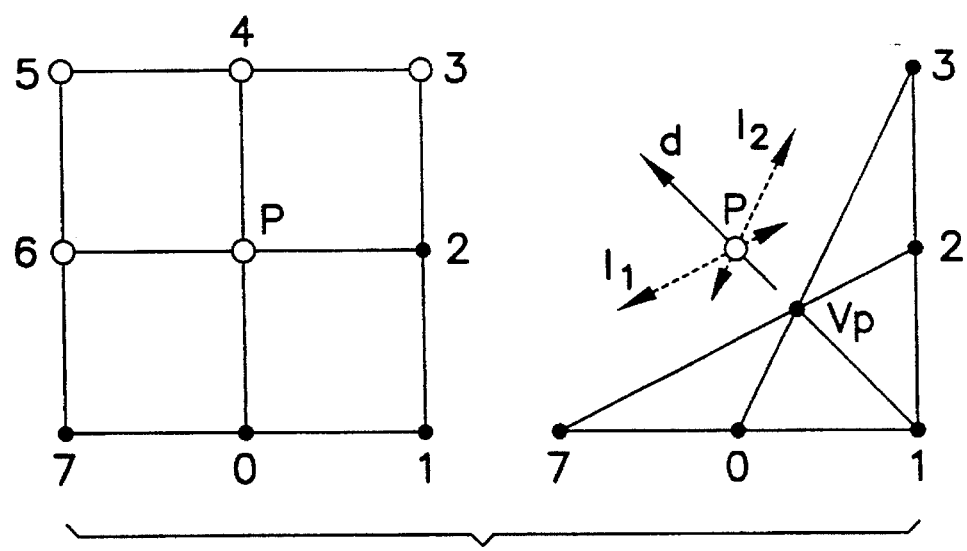
FIG. 9 illustrates a 5-neighbor case, Type B, reduced to a 3-vertex case by considering vertices 7, $V_P$ and 3.

Two types of neighborhood arrangements are possible as shown in FIG. 8 and FIG. 9. In both cases, all the surrounding mapped neighbors are involved in the area calculation since they constitute area enclosing triangles in the topological neighborhood of P. As shown in FIG. 8, the five-vertex case reduces to a three vertex case with adjacent triangles T1(6, 0, P) and T2(0, 2, P). The nominal area loci formulation is modified to account for the change in total area due to the projection of triangles T(6,7,0) and T(0,1,2). For example, the area used to determine area locus $l_2$ is taken as, $$A_{l_2}=\text{Area}(6,0,P)+[\text{Area}(6,7,0)-\text{Area}(6',7',0')] \quad (8)$$

The formulation for area locus $l_1$ is modified in a similar manner. This modification ensures that constant area is maintained between P and its mapped neighbors. The second type of five-neighbor case is shown in FIG. 9. This case is more complicated since it involves included areas in different planes. In this case, a pseudo vertex ($V_P$) is calculated to reduce this case to a similar variation of the standard three-vertex problem (Nair, 1993).

Six adjacent neighbors

Figure 10:
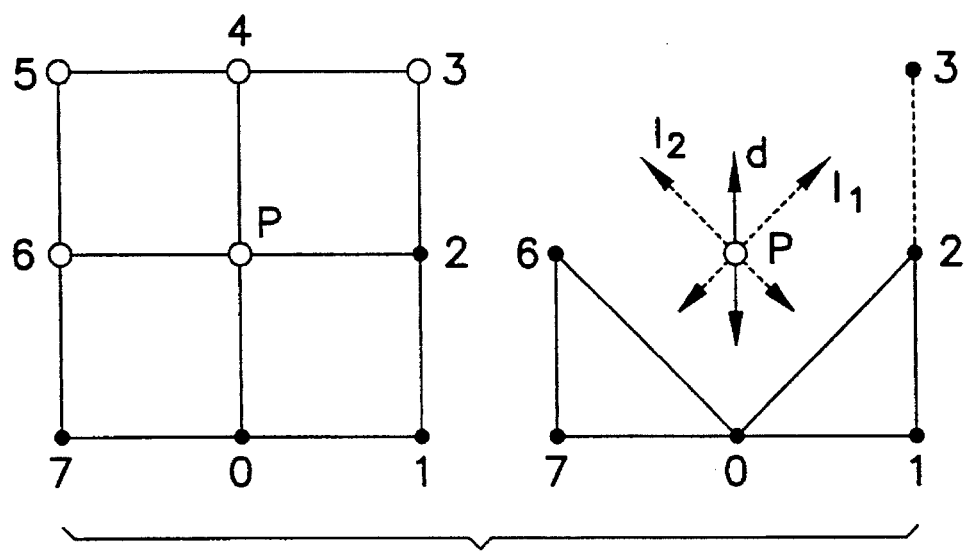
FIG. 10 illustrates the 6-neighbor case, reduced to a five neighbor case.

This situation is reduced to a five-vertex case by eliminating one overhanging neighbor for the same reason as the four adjacent neighbors case. Then the five-vertex technique is employed as shown in FIG. 10.

Seven adjacent neighbors

Figure 11:
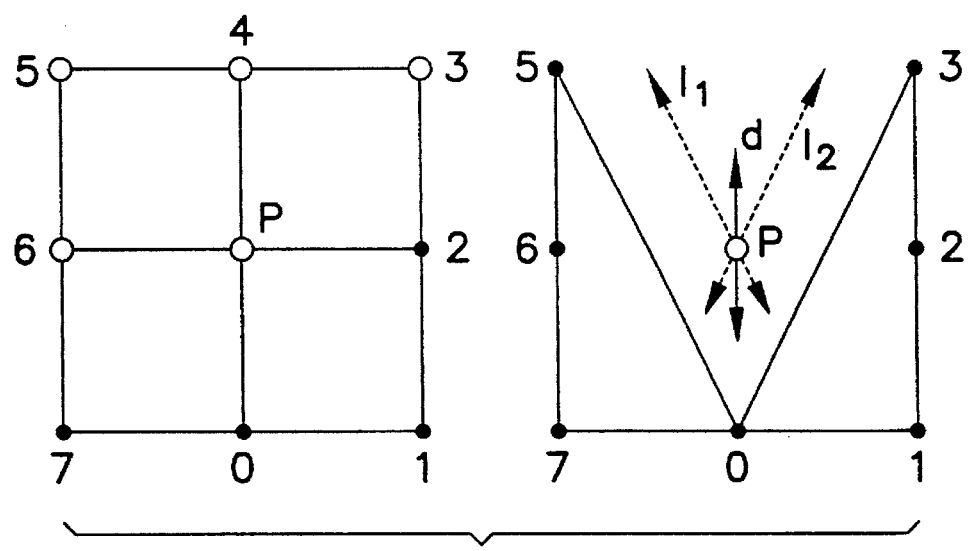
FIG. 11 illustrates a 7-neighbor case, wherein the problem is reduced to a 3-vertex case by considering vertices 5, 0 and 3.

This is similar to type A of the five-vertex case shown in FIG. 11. The case is easily reduced to a three-vertex case by considering two adjacent triangles enclosed by vertices 5, 0, 3 and sharing P as shown in FIG. 11. To preserve area, the net area components of the triangles indicated by the shaded areas are added to the area loci calculation for determining vertex P.

Vertex Mapping

This is the kernel of the algorithm. Prior to this step, all the vertex manipulations are done in the topological space. In this segment of the algorithm, the geometric data is accessed and the area calculations are performed.

```
Algorithm. Map vertex
Input: V_ij and three neighboring mapped vertices.
Output: Vert2D image of V_ij
{
    calculate the area enclosed by the vertices in three-
    dimensional space
    calculate 2D triangle base lengths
    calculate area locus of V_ij from each of the two adjacent
    triangles
    calculate Vert2D(V_ij) = intersection of the two loci
    return Vert2D(V_ij) coordinates
}
```

Mapping Remaining Vertices

After the first vertex and its primary neighbors are mapped, the remaining vertices are scanned by generating a visit list which is initialized with the addresses of the primary neighbors. Primary neighbors of each element of the visit list are queried for mapping via the Vertex map feasibility algorithm. Those which can be mapped, are mapped and appended to the visit list. The algorithm proceeds in this manner until the visit list is exhausted. The algorithm structure follows.

```
Algorithm. Map remaining vertices
Input:   Initialized visit_list with primary neighbors of V_max
Output:  Vert2D coordinates of all vertices of the surface for all
         V_k ∈ visit_list
{
    for all primary neighbors of V_k
    {
        query = Vertex Map Feasibility(Adj(V_k))
        if query = CAN_BE_MAPPED
        {
            Map_the_Vertex(Adj(V_k))
            add Adj(V_k) to the visit_list
        }
    }
}
```

Mapping Examples

Two example applications are presented which demonstrate constant area transformation of surfaces with single peak vertices. Computation times reported reflect implementation on a Silicon Graphics Indigo workstation with 48 MB of RAM.

Figure 12:
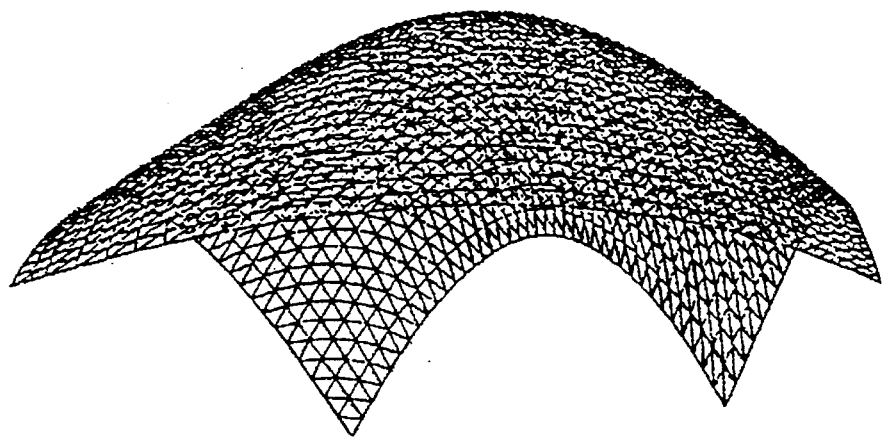
FIG. 12 illustrates an example of a Bezier surface.
Figure 13:
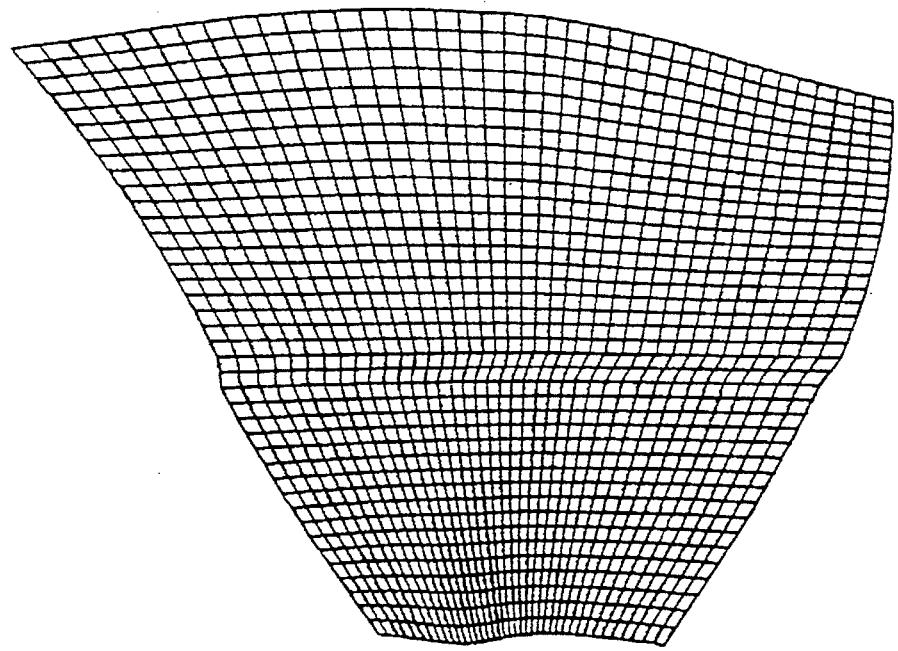
FIG. 13 illustrates an example of map surface, 40×40 parametric subdivisions.

Example 1: Bezier Surface. The fan shaped bicubic Bezier surface shown in FIG. 12 was represented by a 40 by 40 parametric subdivision to yield 1600 vertices on the tessellated surface. The mapping was performed and the result is shown in FIG. 13. The mapping of the surface was well defined and showed fairly uniform material flow over the entire surface. An increase of the parametric sampling produced the same result in slightly greater detail. The computation times for two surface discretization densities are shown in Table 1. As expected, the computation time grew in linear proportion to the number of vertices used to represent the surface.

Figure 14:
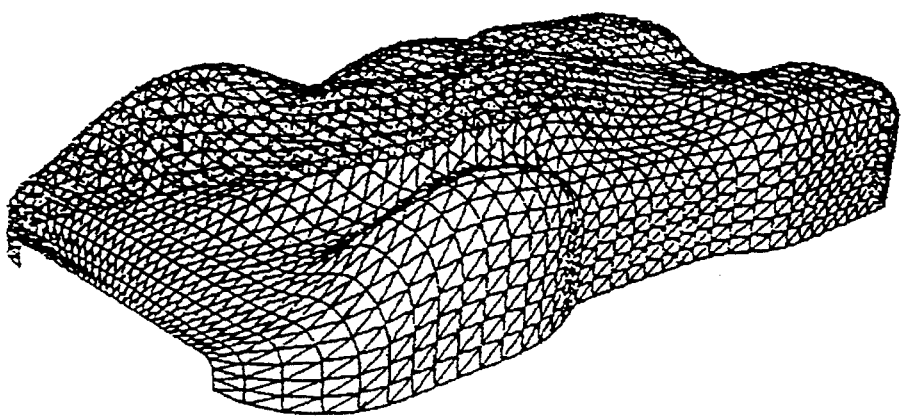
FIG. 14 is an example of a B-spline surface.
Figure 15:
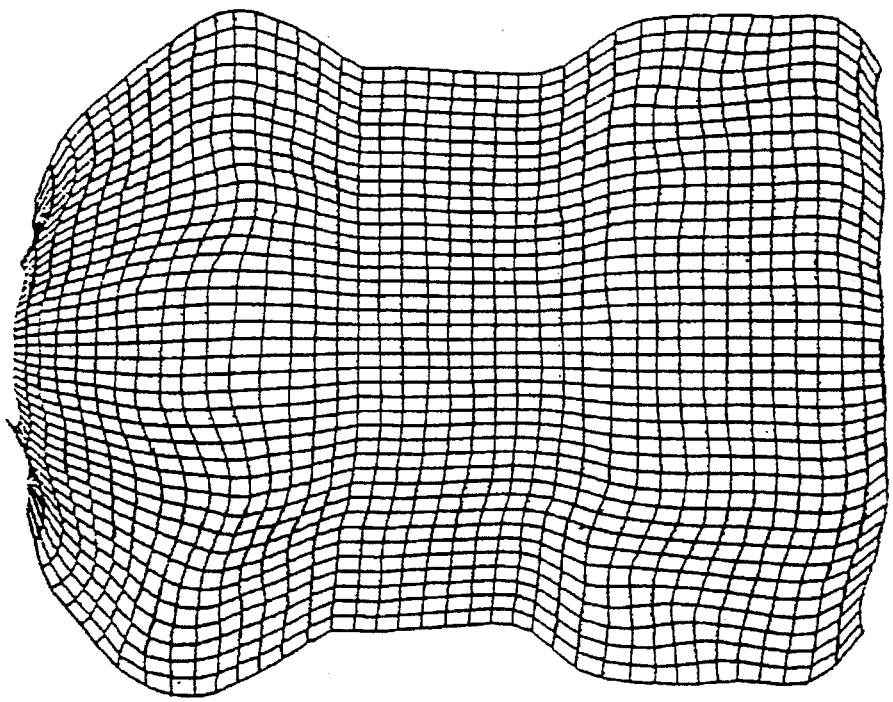
FIG. 15 is an example of a mapped surface, 40×40 parametric subdivision.

EXAMPLE 2: B-spline surface. This example is a more complicated B-spline surface of a toy model sports car body. This surface is characterized by a single peak, flanged edges and multiple peaks at local maxima as shown in FIG. 14. This surface was chosen to study the behavior of the algorithm in the regions of flanges which the previous geometric method developed by Chu (1983), could not handle. A 40×40 grid of surface points was generated and the algorithm was applied to this surface definition. The result is shown in FIG. 15. The algorithm produced very interesting results for the surface. On visual inspection, the material outflow correlated with the probable material inflow during actual forming operation. The mapping showed a slight bunching of the grid elements in the lower-most edge of the surface near the front of the car body. This corresponds to a region of complex curvature on the original surface, thereby signifying that the edge will have severe compressive forces acting on it, resulting in possible wrinkles. The remaining portion of the surface showed no severe area distortion. The computational results for the surface are summarized in Table 1.

Robustness Issues

Numerical degeneracy arises during computation of an intersection point when the generated area loci are nearly parallel to each other. Since the basic methodology of the constant area transformation algorithm is propagation of areas from the center, any numerical error propagates, resulting in the failure of the algorithm. Although, this is not a deficiency of the algorithm, the resulting blank can be influenced considerably by the ability to detect and accommodate this computational error (Nair, 1993). From these and other tests, it is apparent that the algorithm's results are accurate for increased discretization of the design surface. Since the algorithm is linear time, the technique is computationally inexpensive. This is a very attractive feature for the algorithm's implementation as a general design aid.

TABLE 1

SURFACE MAPPING RESULTS

| | Discretization | Example 1: Bezier Surface | | Example 2: B-spline surface | |
| --- | --- | --- | --- | --- | --- |
| | | 40 × 40 | 60 × 60 | 40 × 40 | 60 × 60 |
| Area Calculation | Computation Time (sec) | 1.22 | 1.90 | 1.35 | 1.60 |
| | 3D Area | 8.52 | 8.52 | 17.66 | 17.70 |
| | 2D Area | 8.52 | 8.52 | 17.66 | 17.70 |
| | Change (%) | 0.0012 | 0.0005 | 0.0140 | 0.0072 |

System Hardware and Software

Figure 16:
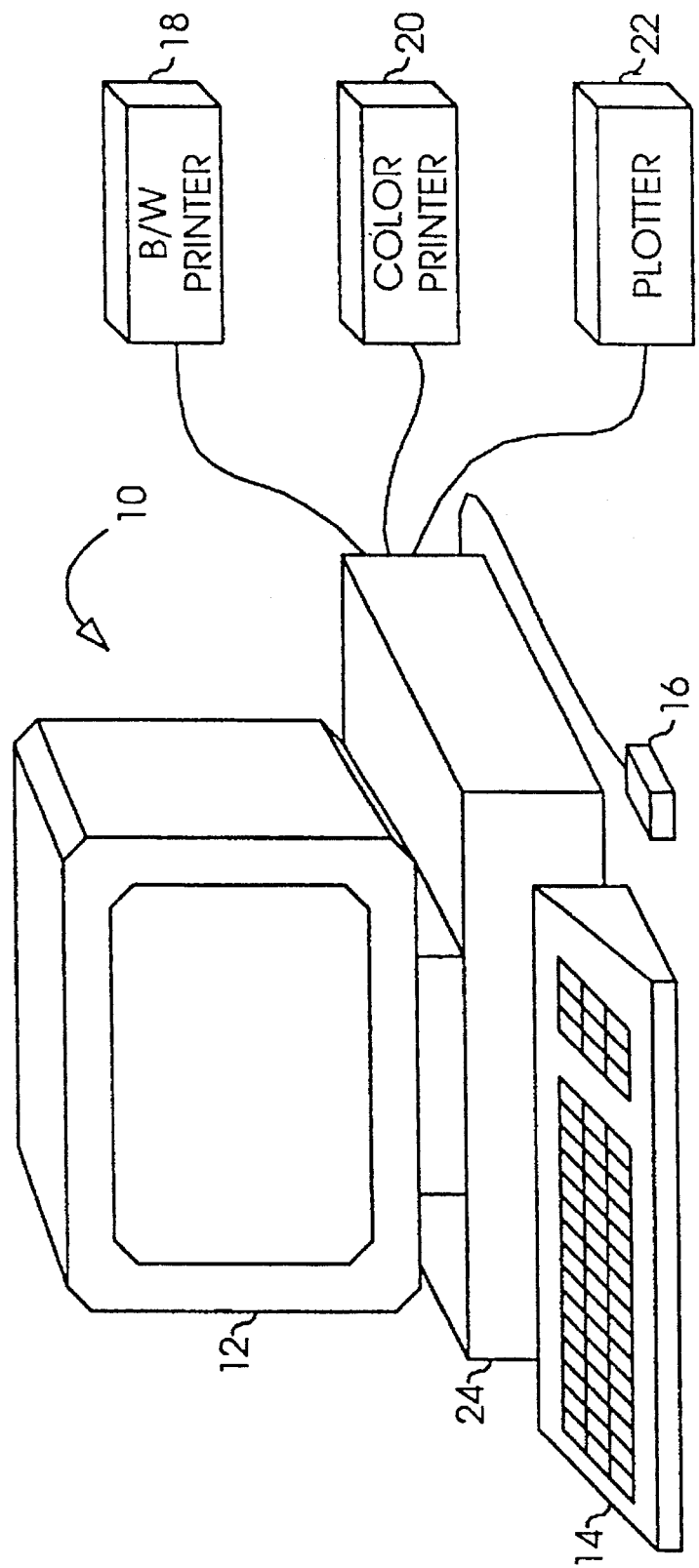
FIG. 16 is a simplified schematic diagram of the hardware of the present invention.
Figure 17A:
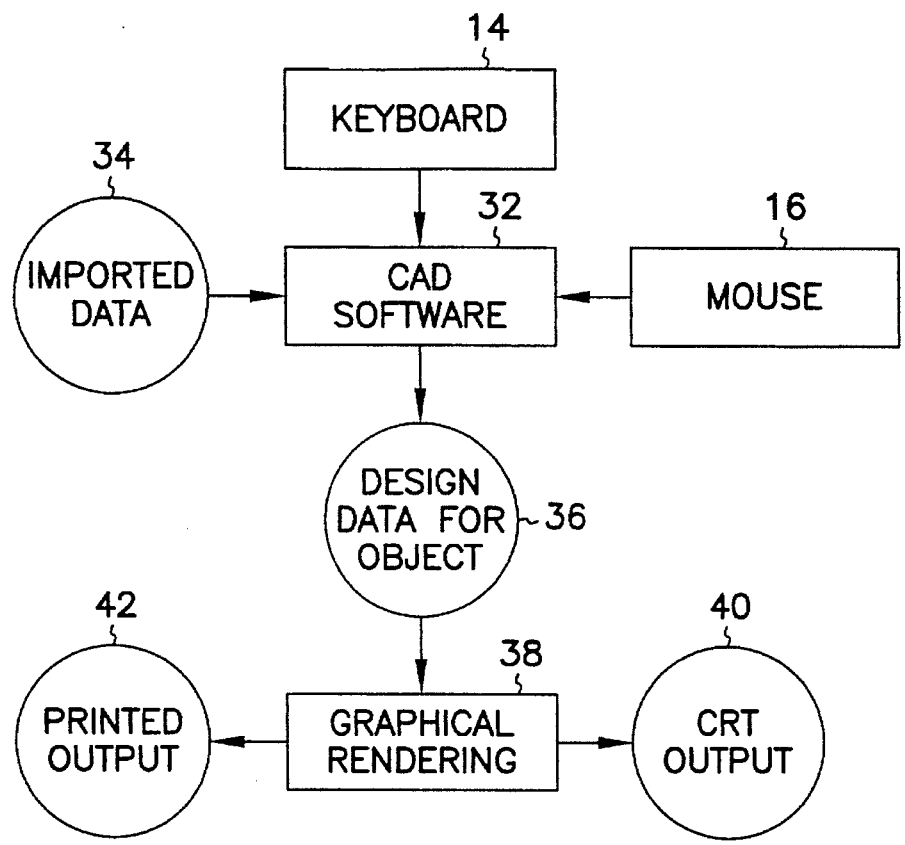
FIGS. 17A and 17B are simplified block diagrams of a computer-aided design system, according to the present invention.
Figure 17B:
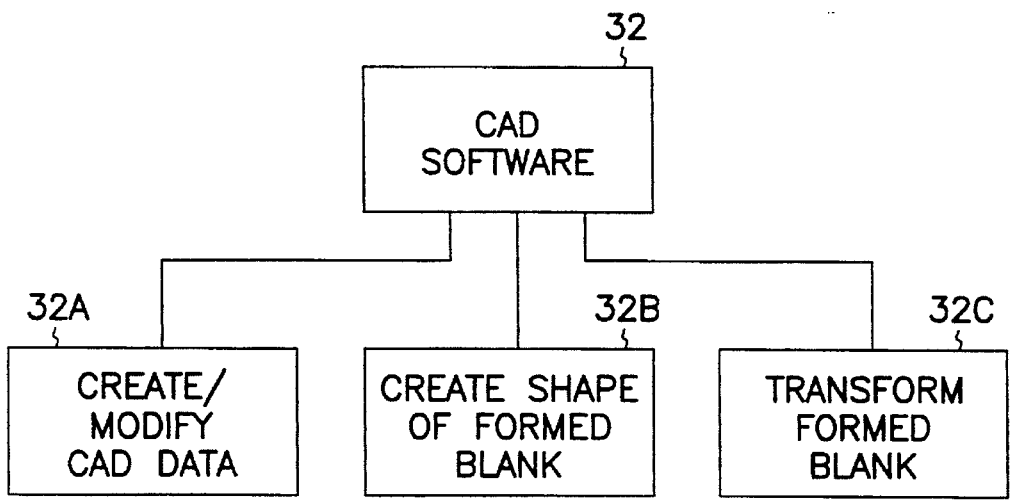

The hardware system of the present invention and a software implementation of the blank development system of the present invention are illustrated in FIGS. 9–12. As shown in FIG. 16, the system includes a workstation 10 (for example a Silicon Graphics Indigo/Elan workstation with a UNIX operating system) including a monitor 12, keyboard 14, mouse 16, black and white printer 18, color printer 20, and printer/plotter 22. Housed in chassis 24 are various other system components including the CPU and other supporting processors, mass storage and random access memory (RAM). To create and/or modify designs of objects for which surfaces are to be configured, the workstation 10 may be programmed with CAD or solid or geometric modelling software (hereinafter referred to as "CAD software") 30, as illustrated in simplified block diagram form in FIGS. 17A and 17B. CAD software 30 includes routines and modules 32 for creating and modifying design data representing a design object (32A), creating a desired shape of a formed blank (32B), and for unforming the blank (32C). Software 32 receives input from the keyboard 14 and mouse 16 for this purpose. Software 32 can also import object design data from another source 34, such as a file developed on another system. Software 32, operating on the workstation, produces design data 36 (preferably in a NURBS format), which can be rendered graphically by software routines and modules 38, which produce CRT or printed output 40 and 42 respectively.

Figure 18:
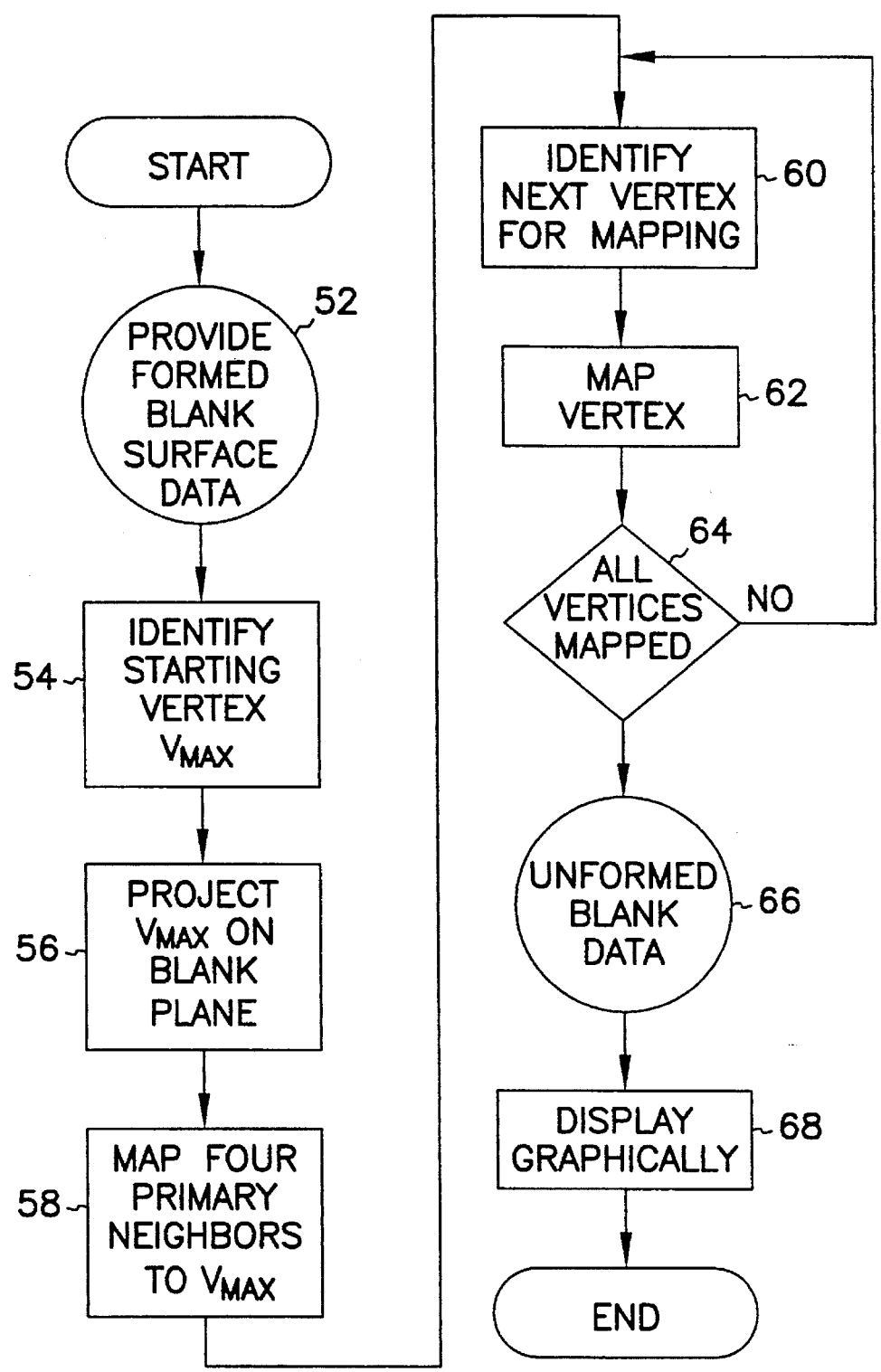
FIG. 18 is a simplified flow chart of the area preserving transformation software, according to the present invention.

Referring now to FIG. 18, there is shown in simplified form the software 32C of the present invention. Formed blank surface data 52 is provided and a starting vertex Vmax is identified (54). Vmax is projected on the blank plane (56). Four neighboring vertices are identified and mapped onto the blank plane (58). A remaining vertex is identified for mapping (60), and mapped (62). If all vertices have been mapped (64), the process produces data representing the shape of the unformed blank (66), and there is a graphical display of the unformed blank (68). Otherwise, the process continues mapping until all vertices are mapped. A computer program, written in the C language, for carrying out the functions of software 32C, is listed in the Microfiche Appendix herewith.

Figure 19:
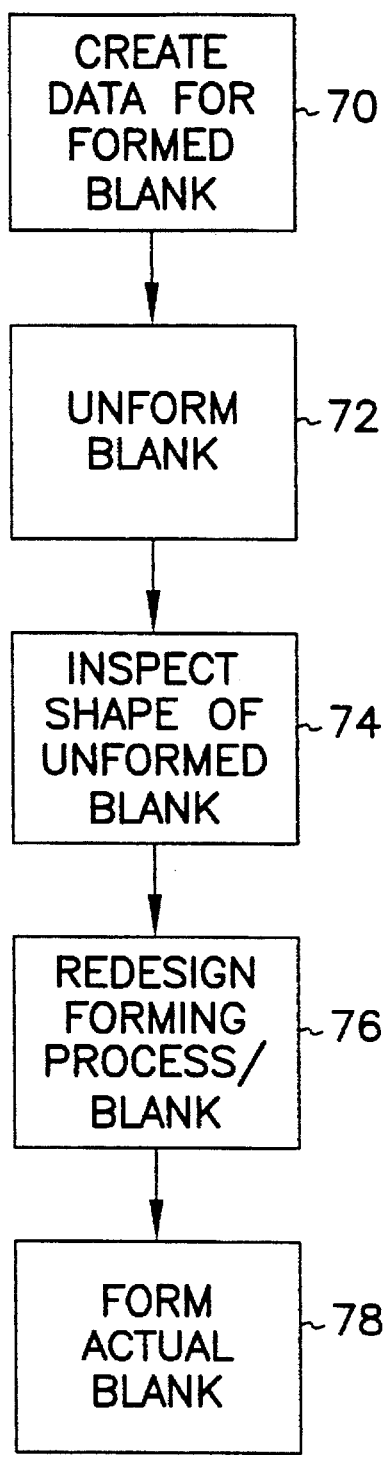
FIG. 19 is a simplified block diagram of a press forming blank development process, according to the present invention.

Referring now to FIG. 19, the method of blank design and forming is outlined in simplified block diagram form. A formed blank design is created (70), representing a desired shape of formed blank. The blank is unformed using software 32C, and displayed (72). The unformed blank shape is inspected (74), and the parameters of the starting blank and forming process are adjusted (76). Finally, the actual formed blank is created (78).

The results obtained from the present invention indicate that it provides a robust and computationally efficient technique for press forming blank development. The efficiency of the technique is due to the fact that geometric feasibility is independent of material property. It is interesting to note that other researchers have reached similar conclusions in considering the manufacturability of parts comprised of layered composite materials (Tam and Gutowski, 1990; Gutowski et al., 1991). Thus, the simplicity of the underlying algorithm and its corresponding linear time complexity make this constant area technique quite suitable for implementation as an interactive design aide.

The technique of the present invention was initially conceived as an ancillary function for sculptured surface model synthesis (Oliver et al., 1993), as disclosed in U.S. patent application Ser. No. 08/106,403, filed on even date herewith, and entitled "Sculptured Surface Synthesis Based on Functional Design Constraints." Although the constant area transformation technique has emerged as a useful tool by itself, a major focus has been to develop a general formability constraint to be incorporated into the sculptured surface model synthesis technique (Oliver and Theruvakattil, 1993). As a stand alone design aide, it is believed that the constant area transformation algorithm can be enhanced in several ways. For example, the method can be extended to accommodate more general surface models to handle merging of multiple fronts from several peaks and stages simultaneously. In addition, other mapping strategies, such as volume conservation and/or minimum energy path, can be investigated. The method can also be extended to provide a qualitative measure of surface strains. It is hoped that these additional capabilities will provide a more accurate assessment of formability for complex surfaces.

REFERENCES

Chu, E., 1983, "New Horizons in Computer-Aided Design of Sheet Metal Srampings," Ph.D. Dissertation, McMaster University, Montreal.

Chu, E., Soper, D., Gloekl, H., and Gerdeen, J. C., 1985, "Computer-Aided Geometric Simulation of Sheet Metal Forming Processes," Proceedings of the symposium on Computer Modeling of Sheet Metal Forming Processes, sponsored by The Metallurgical Society, held at the 12th annual Automotive Material Symposium, Ann Arbor, Mich., pp. 65–76.

Clements, J. C., 1981, "A Computer System to Derive Developable Hull Surfaces and Tables of Offsets," Marine Technology, Vol. 18, No. 3, pp. 227–233.

Clements, J. C., and Leon, L. J., 1987, "A Fast, Accurate Algorithm for the Isometric Mapping of a Developable Surface," SIAM Journal for Mathematical Analysis, Vol. 18, No. 4, pp. 966–971.

Light, R. A., and Gossard, D. C., 1982, "Modification of Geometric Models through Variational Geometry," Computer Aided Design, Vol. 14, No. 4, pp. 209–214.

Lin, V. C., Gossard, D. C., and Light, R. A., 1981, "Variational Geometry in Computer-Aided Design," Computer Graphics, Vol. 15, No. 3, pp. 171–177.

Mortenson, M. E., 1985, Geometric Modeling, Wiley, N.Y.

Nair, N. K., 1993, "Development of Manufacturability Constraints for Press Forming of Sheet Metal Components," Master's Thesis, Iowa State University.

Oliver, J. H., and Theruvakattil, P. C., 1993, "Sculptured Surface Model Based on Functional Design Constraints," To be presented at the ASME Design Automation Conference, Albuquerque, N. Mex., September, 1993.

Oliver, J. H., Theruvakattil, P. C., Nair, N. K., 1993, "Towards Automated Generation of Sculptured Surface Models," Proceedings of the 1993 NSF Design and Manufacturing Systems Conference, Vol. 1, pp. 663–640.

Piegl, L. and Tiller, W., 1987, "Curves and Surface Construction Using Rational B-splines," Computer-Aided Design, Vol. 19, No. 9, pp. 485–497.

Redont, P., 1989, "Representation and Deformation of Developable Surfaces," Computer-Aided Design, Vol. 21, No. 1, pp. 13–20.

Shimada, T., and Tada, Y., 1989, "Development of Curved Surfaces using Finite Element Method," Proceedings of the first international conference on Computer-Aided Optimum Design of Structures, Recent Advances, Springer-Verlag, N.Y., pp. 23–30.

Shimada, T., and Tada, Y., 1991, "Approximate Transformation of Arbitrary Curved Surface into a Plane using Dynamic Programming," Computer-Aided Design, Vol. 23, No. 2, pp. 153–159.

Tam, A. S., and Gutowski, T. G., 1990, "The Kinematics for Forming Ideal Aligned Fibre Composites into Complex Shapes," Composites Manufacturing, Vol. 1, No. 4, pp. 219–228.

Gutowski, T. G., Hoult, D., Dillon, G., and Gonzalez-Zugasti, J., 1991, "Differential Geometry and the Forming of Aligned Fibre Composites," Composites Manufacturing, Vol. 2, No. 3, pp. 147–152.

We claim:

1. A method for simulation of blank forming using a punch, the simulation carried out on a computer having an output device, wherein the blank plane is assumed to be a global XY plane and the punch to travel parallel to a Z axis of XY plane, comprising the steps of:

(a) providing the computer a polyhedral surface model for a deformed blank, wherein each plane defining the surface is triangular and exists in three-dimensional Euclidean space, the surface model comprising data including a plurality N (an integer) of surface vertices;

(b) using the computer, identifying a first vertex $V_{init}$ and mapping it to a blank plane parallel to the XY plane;

(c) using the computer, mapping at least two primary neighboring vertices to $V_{init}$ onto the blank plane;

(d) using the computer, determining whether at least three adjacent vertices have already been mapped for an unmapped vertex, and if the criterion is met, identifying the unmapped vertex as one that can be mapped, and if not, one that cannot yet be mapped, the unmapped vertex associated with a triangular plane;

(e) using the computer, mapping a vertex identified as mappable onto the blank plane using a constant area transformation to map the associated triangular plane to the blank plane, the constant area transformation conserving both the topology and area of the triangular plane;

(f) repeating steps (d) and (e) until all remaining vertices are mapped so that unformed blank data representing a two-dimensional shape of an unformed blank corresponding to the deformed blank is obtained;

(g) using the unformed blank data, graphically displaying the unformed blank on the output device; and wherein the constant area transformation is based substantially on the following principles:

Given the location of two vertices $V'_i$ and $V'_j$, a family of triangles $T(V'_i, V'_j, V'_k)$ of area A is defined by the area locus l of the point $V_k$ which is a line parallel to $V'_iV'_j$ at a distance $h=2A/|V'_iV'_j|$ from $V'_iV'_j$; and Given two adjacent triangles $T_a(V_i, V_j, V_l)$ and $T_b(V_k, V_i, V_l)$ and corresponding projected locations of any three of these vertices in a plane in $E^2$, if the unknown common vertex $V_l \epsilon E^2$ is located at the intersection of area loci $l_a \leftarrow T_a(V'_i, V'_j, V'_l)$ and $l_b \leftarrow T_b(V'_k, V'_i, V'_l)$, then $$\text{Area}(V_i, V_j, V_l) = \text{Area}(V'_i, V'_j, V'_l)$$

and $$\text{Area}(V_k, V_i, V_l) = \text{Area}(V'_k, V'_i, V'_l).$$

2. A method according to claim 1, further wherein there are cases in which more than the minimum of three mapped neighboring vertices exist for mapping, and wherein the method further includes the step of eliminating extra vertices to reduce these cases to three-vertex cases.

3. A method according to claim 1 further wherein in step (c) the at least two primary neighboring vertices are mapped using a length of line preservation procedure.

4. A method according to claim 1 further including the step of selecting $V_{init}$ by identifying the vertex with the largest Z-value.

5. A method according to claim 1 further including the step of selecting $V_{init}$ by identifying a vertex from an area of surface points on a plateau at the maximum Z-axis value.

6. A method according to claim 4 further wherein $V_{init}$ is mapped onto the blank plane by projecting it parallel to the Z-axis onto the blank plane.

7. A method according to claim 5 further wherein $V_{init}$ is mapped onto the blank plane by projecting it parallel to the Z-axis onto the blank plane.

8. A method for simulation of blank forming using a punch, the simulation carried out on a computer having an output device, wherein the blank plane is assumed to be a global XY plane and the punch to travel parallel to a Z-axis of the XY plane, comprising the steps of:

(a) providing the computer a polyhedral surface model for a deformed blank, wherein each plane defining the surface is polyhedral and exists in three-dimensional Euclidean space, the surface model comprising data including a plurality N (an integer) of surface vertices;

(b) using the computer, identifying a vertex $V_{init}$ representative of a point of maximum punch travel along the Z-axis into the deformed blank, and mapping $V_{init}$ to a blank plane parallel to the XY plane;

(c) using the computer, mapping at least two primary neighboring vertices to $V_{init}$ onto the blank plane;

(d) using the computer, mapping the remaining vertices concentrically outward from the $V_{init}$ and its neighbors to simulate the inflow of material on the blank plane in the forming process, to provide data representative of the unformed blank, and using a constant area transformation to map the polyhedral planes from the surface model to the blank plane;

(e) graphically displaying the unformed blank; and wherein the constant area transformation is based substantially on the following principles:

Given the location of two vertices $V'_i$ and $V'_j$, a family of triangles $T(V'_i, V'_j, V'_k)$ of area A is defined by the area locus l of the point $V_k$ which is a line parallel to $V'_iV'_j$ at a distance $h=2A/|V'_iV'_j|$ from $V'_iV'_j$; and Given two adjacent triangles $T_a(V_i, V_j, V_l)$ and $T_b(V_k, V_j, V_l)$ and corresponding projected locations of any three of these vertices in a plane in $E^2$, if the unknown common vertex $V_l \epsilon E^2$ is located at the intersection of area loci $l_a \leftarrow T_a(V'_i, V'_j, V'_l)$ and $l_b \leftarrow T_b(V'_k, V'_i, V'_l)$, then $$\text{Area}(V_i, V_j, V_l) = \text{Area}(V'_i, V'_j, V'_l)$$

and $$\text{Area}(V_k, V_i, V_l) = \text{Area}(V'_k, V'_i, V'_l).$$

9. A method for simulation of blank forming using a punch, the simulation carried out on a computer having an output device, wherein the blank plane is assumed to be a global XY plane and the punch to travel parallel to a Z axis of the XY plane, comprising the steps of:

(a) providing the computer a polyhedral surface model for a deformed blank, wherein each plane defining the surface is triangular and exists in three-dimensional Euclidean space, the surface model comprising data including a plurality N (an integer) of surface vertices;

(b) using the computer, mapping surface vertices from the deformed blank onto a blank plane parallel to the XY plane, the vertices mapped using a constant area transformation to map a triangular plane associated with each mapped vertex, wherein the transformation conserves both the area and topology of the associated triangular plane, to provide data representative of an unformed blank;

(c) using the data representative of the unformed blank, displaying the unformed blank on the output device; and wherein the constant area transformation is based on the following principles;

Given the location of two vertices $V'_i$ and $V'_j$, a family of triangles $T(V'_i, V'_j, V'_k)$ of area A is defined by the area locus l of the point $V_k$ which is a line parallel to $V'_iV'_j$ at a distance $h=2A/|V'_iV'_j|$ from $V'_iV'_j$; and Given two adjacent triangles $T_a(V_i, V_j, V_l)$ and $T_b(V_k, V_i, V_l)$ and corresponding projected locations of any three of these vertices in a plane in $E^2$, if the unknown common vertex $V_1 \epsilon E^2$ is located at the intersection of area loci $l_a \leftarrow T_a(V'_i, V'_j, V'_l)$ and $l_b \leftarrow T_b(V'_k, V'_i, V'_l)$, then $$\text{Area}(V_i, V_j, V_l) = \text{Area}(V'_i, V'_j, V'_l)$$

and $$\text{Area}(V_k, V_i, V_l) = \text{Area}(V'_k, V'_i, V'_l).$$

10. Computer-aided design apparatus including a system for simulation of blank forming using a punch, wherein the blank plane is assumed to be a global XY plane and the punch to travel parallel to a Z axis of XY plane, comprising:

(a) computer-aided design means for designing a surface model of a part to be created by forming a blank with a punch, including means for representing the surface model as a polyhedral surface model for a deformed blank, wherein each plane defining the surface is triangular and exists in three-dimensional Euclidean space, the surface model comprising data including a plurality N (an integer) of surface vertices;

(b) means for identifying a first vertex $V_{init}$ and mapping it to a blank plane parallel to the XY plane;

(c) means for mapping at least two primary neighboring vertices to $V_{init}$ onto the blank plane;

(d) means for determining whether at least three adjacent vertices have already been mapped for an unmapped vertex, and if the criterion is met, identifying the unmapped vertex as one that can be mapped, and if not, one that cannot yet be mapped, the unmapped vertex associated with a triangular plane;

(e) means for mapping vertices identified as mappable onto the blank plane using a constant area transformation to map the associated triangular plane to the blank plane, the constant area transformation conserving both the topology and area of the triangular plane, said means for mapping continuing until all remaining vertices are mapped so that unformed blank data representing a two-dimensional shape of an unformed blank corresponding to the deformed blank is obtained;

(f) means using the unformed blank data for graphically displaying the unformed blank on the output device; and wherein the constant area transformation is based substantially on the following principles:

Given the location of two vertices $V'_i$ and $V'_j$, a family of triangles $T(V'_i, V'_j, V'_k)$ of area A is defined by the area locus l of the point $V_k$ which is a line parallel to $V'_iV'_j$ at a distance $h=2A/|V'_iV'_j|$ from $V'_iV'_j$; and Given two adjacent triangles $T_a(V_i, V_j, V_l)$ and $T_b(V_k, V_j, V_l)$ and corresponding projected locations of any three of these vertices in a plane in $E^2$, if the unknown common vertex $V_l \epsilon E^2$ is located at the intersection of area loci $l_a \leftarrow T_a(V'_i, V'_j, V'_l)$ and $l_b \leftarrow T_b(V'_k, V'_i, V'_l)$, then $$\text{Area}(V_i, V_j, V_l) = \text{Area}(V'_i, V'_j, V'_l)$$

and $$\text{Area}(V_k, V_i, V_l) = \text{Area}(V'_k, V'_i, V'_l).$$

11. Apparatus according to claim 10, further wherein there are cases in which more than the minimum of three mapped neighboring vertices exist for mapping, and further including means for eliminating extra vertices to reduce these cases to three-vertex cases.

12. Apparatus according to claim 10 further including means for mapping the at least two primary neighboring vertices using a length of line preservation procedure.

13. Apparatus to claim 10 further including means for selecting $V_{init}$ by identifying the vertex with the largest Z-value.

14. Apparatus according to claim 13 further wherein including means for mapping $V_{init}$ onto the blank plane by projecting it parallel to the Z-axis onto the blank plane.

15. Apparatus according to claim 10 further including means for selecting $V_{init}$ by identifying a vertex from an area of surface points on a plateau at the maximum Z-axis value.

16. Apparatus according to claim 15 further including means for mapping $V_{init}$ onto the blank plane by projecting it parallel to the Z-axis onto the blank plane.

17. Computer-aided design apparatus including a system for simulation of blank forming using a punch, the simulation carried out on a computer having an output device, wherein the blank plane is assumed to be a global XY plane and the punch to travel parallel to a Z axis of the XY plane, comprising the steps of:

(a) computer-aided design means for designing a surface model of a part to be created by forming a blank with a punch, including means for representing the surface model as providing the computer a polyhedral surface model for a deformed blank, wherein each plane defining the surface is triangular and exists in three-dimensional Euclidean space, the surface model comprising data including a plurality N (an integer) of surface vertices;

(b) means for mapping surface vertices from the deformed blank onto a blank plane parallel to the XY plane, the vertices mapped using a constant area transformation to map a triangular plane associated with each mapped vertex, wherein the transformation conserves both the area and topology of the associated triangular plane, to provide data representative of an unformed blank;

(c) means using the data representative of the unformed blank for displaying the unformed blank on the output device and wherein the constant area transformation is based substantially on the following principles:

Given the location of two vertices $V'_i$ and $V'_j$, a family of triangles $T(V'_i, V'_j, V'_k)$ of area A is defined by the area locus l of the point $V_k$ which is a line parallel to $V'_i V'_j$ at a distance $h=2A/|V'_i V'_j|$ from $V'_i V'_j$; and Given two adjacent triangles $T_a(V_i, V_j, V_l)$ and $T_b(V_k, V_i, V_l)$ and corresponding projected locations of any three of these vertices in a plane in $E^2$, if the unknown common vertex $V_1 \epsilon E^2$ is located at the intersection of area loci $l_a \leftarrow T_a(V'_i, V'_j, V'_l)$ and $l_b \leftarrow T_b(V'_k, V'_i, V'_l)$, then $$\text{Area}(V_i, V_j, V_l) = \text{Area}(V'_i, V'_j, V'_l)$$

and $$\text{Area}(V_k, V_i, V_l) = \text{Area}(V'_k, V'_i, V'_l).$$

18. A method for designing a part using simulation of blank forming using a punch, the simulation carried out on a computer having an output device, wherein the blank plane is assumed to be a global XY plane and the punch to travel parallel to a Z axis of the XY plane, comprising the steps of:

(a) using the computer designing a part to be formed by deforming a blank with a punch;

(b) providing the computer a polyhedral surface model for a deformed blank, wherein each plane defining the surface is triangular and exists in three-dimensional Euclidean space, the surface model comprising data including a plurality N (an integer) of surface vertices;

(c) using the computer, mapping surface vertices from the deformed blank onto a blank plane parallel to the XY plane, the vertices mapped using a constant area transformation to map a triangular plane associated with each mapped vertex, wherein the transformation conserves both the area and topology of the associated triangular plane, to provide data representative of an unformed blank;

(d) using the data representative of the unformed blank, displaying the unformed blank on the output device;

(e) altering the design of the part based on the graphical display;

(f) forming the part from a blank using a punch; and wherein the constant area transformation is based substantially on the following principles:

Given the location of two vertices $V'_i$ and $V'_j$, a family of triangles $T(V'_i, V'_j, V'_k)$ of area A is defined by the area locus l of the point $V_k$ which is a line parallel to $V'_i V'_j$ at a distance $h=2A/|V'_i V'_j|$ from $V'_i V'_j$; and Given two adjacent triangles $T_a(V_i, V_j, V_l)$ and $T_b(V_k, V_i, V_l)$ and corresponding projected locations of any three of these vertices in a plane in $E^2$, if the unknown common vertex $V_l \epsilon E^2$ is located at the intersection of area loci $l_a \leftarrow T_a(V'_i, V'_j, V'_l)$ and $l_b \leftarrow T_b(V'_k, V'_i, V'_l)$, then $$\text{Area}(V_i, V_j, V_l) = \text{Area}(V'_i, V'_j, V'_l)$$

and $$\text{Area}(V_k, V_i, V_l) = \text{Area}(V'_k, V'_i, V'_l).$$

* * * * *

UNITED STATES PATENT AND TRADEMARK OFFICE
CERTIFICATE OF CORRECTION

PATENT NO. : 5,561,754

DATED : October 1, 1996

INVENTOR(S) : James H. Oliver et al.

It is certified that error appears in the above-identified patent and that said Letters Patent is hereby corrected as shown below:

At Column 1, line 8, please delete "N0014-92-J-4092" and insert --N00014-92-J-4092--.

At Column 16, line 24, please delete "$V_j,V_l$)" and insert --$V_i,V_l$)--.

Signed and Sealed this

Eighteenth Day of November 1997

*Attest:*

BRUCE LEHMAN

*Attesting Officer*  Commissioner of Patents and Trademarks